United States Patent
Lee et al.

(10) Patent No.: US 7,394,279 B2
(45) Date of Patent: Jul. 1, 2008

(54) METHOD OF MEASURING A SURFACE VOLTAGE OF AN INSULATING LAYER

(75) Inventors: Mi-Sung Lee, Seoul (KR); Yu-Sin Yang, Seoul (KR); Chung-Sam Jun, Gyeonggi-do (KR); Byung-Sug Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 146 days.

(21) Appl. No.: 11/461,312

(22) Filed: Jul. 31, 2006

(65) Prior Publication Data

US 2007/0023834 A1     Feb. 1, 2007

(30) Foreign Application Priority Data

Jul. 30, 2005     (KR)     ............... 10-2005-0069954

(51) Int. Cl.
  *G01R 31/26*     (2006.01)
  *G01R 19/00*     (2006.01)
  *G01R 31/08*     (2006.01)

(52) U.S. Cl. .............. 324/765; 324/76.11; 324/522

(58) Field of Classification Search ........... 324/765, 324/76.11, 522
See application file for complete search history.

(56) References Cited

U.S. PATENT DOCUMENTS

| 4,812,756 A | * | 3/1989 | Curtis et al. ............... 324/750 |
| 5,485,091 A | | 1/1996 | Verkuil et al. |
| 7,075,318 B1 | * | 7/2006 | Zhang et al. ............... 324/750 |

FOREIGN PATENT DOCUMENTS

| JP | 2003-092319 | 3/2003 |
| JP | 2004-111911 | 4/2004 |

OTHER PUBLICATIONS

English language abstract of Japanese Publication No. 2003-092319 Pub. Date: Mar. 28, 2003.
English language abstract of Japanese Publication No. 2004-111911 Pub. Date: Apr. 8, 2004.

* cited by examiner

*Primary Examiner*—Andrew H Hirshfeld
*Assistant Examiner*—Amy He
(74) *Attorney, Agent, or Firm*—Marger Johnson & McCollom, P.C.

(57) ABSTRACT

In a method of measuring a surface voltage of an insulating layer, the number of times that surface voltages are measured in a depletion region increases so that precise data about the depletion region may be obtained. The number of times that the surface voltages are measured in an accumulation region and an inversion region decreases so that the data about the depletion region may be rapidly obtained.

15 Claims, 4 Drawing Sheets

METHOD OF MEASURING A SURFACE VOLTAGE OF AN INSULATING LAYER

CROSS REFERENCE TO RELATED APPLICATIONS

This application claims priority from Korean Patent Application No. 10-2005-69954, which was filed on 30 Jul. 2005. Korean Patent Application No. 10-2005-69954 is incorporated herein by reference in its entirety.

BACKGROUND

1. Technical Field

This disclosure relates to a method of measuring a surface voltage of an insulating layer and more particularly, to a method of measuring a surface voltage of an insulating layer by supplying charges to the insulating layer.

2. Description of the Related Art

A measuring device for measuring a surface voltage of an insulating layer may include a probe and a gun. To measure the surface voltage, the insulating layer is typically placed under the probe and the gun.

During a light state when the insulating layer is irradiated with light, a predetermined amount of positive charges is repeatedly applied to the insulating layer so that a surface charge amount of the insulating layer may be increased by a discrete amount with each application. The gun may repeatedly supply the predetermined amount of the positive charges onto the insulating layer by using the probe.

In addition, the first surface charge amount of the insulating layer may be measured each time that the positive charges are supplied onto the insulating layer. Here, the probe may measure the first surface charge amount of the insulating layer.

Thereafter, during a dark state when the insulating layer is not irradiated with light, the surface charge amount of the insulating layer may reset to an initial state that was measured before the positive charges were initially supplied to the insulating layer.

Thereafter, during another light state, the predetermined amount of positive charges is repeatedly applied to areas of the insulating layer that were not provided with light during the first light state so that the surface charge amount of the insulating layer may be increased by a discrete amount with each application. In addition, a second surface charge amount of the insulating layer is measured each time that the positive charges are supplied onto the insulating layer.

Thereafter, the first surface charge amount is compared with the second charge amount so that data concerning an accumulation region, a depletion region, and an inversion region of the insulating layer may be obtained. The accumulation region is a region where the first surface voltage is substantially the same as the second surface voltage, the depletion region is a region where a difference between the first surface voltage and the second surface voltage increases, and the inversion region is a region where the difference between the first surface voltage and the second surface voltage is constantly maintained at a predetermined positive value.

In general, the depletion region has information concerning an interface trap density, a flat band voltage, and a total charge amount. Thus, the depletion region is more important than the accumulation region and the inversion region.

However, when the same amount of the positive charges are supplied in the depletion region as well as the accumulation region and the inversion region, the time required to measure the surface charge of the insulating layer may be unfortunately long.

When the predetermined amount of positive charge is decreased to reduce the number of times that the first and second surface charges of the insulating layer are measured, the time required for measuring the surface charge of the insulating layer may also decrease. However, the number of times that the first and second surface charges of the insulating layer are measured may be reduced in the depletion region as well as the accumulation region and the inversion region. Thus, it becomes difficult to obtain precise data about the depletion region.

Embodiments of the invention address these and other disadvantages of the related art.

SUMMARY

Embodiments of the invention provide methods of measuring a surface voltage of an insulating layer that are capable of quickly obtaining relatively precise data about a depletion region.

BRIEF DESCRIPTION OF THE DRAWINGS

The above and other advantages of the invention will become readily apparent by reference to the following detailed description when considered in conjunction with the accompanying drawings that are briefly described below.

DETAILED DESCRIPTION

Figure 1:
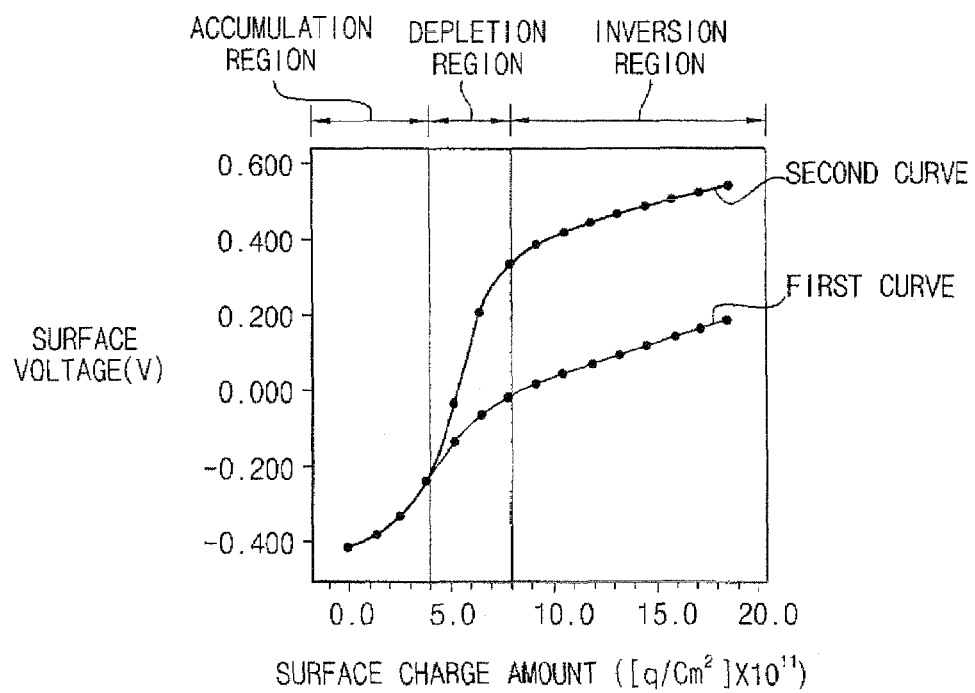
FIG. 1 is a graph illustrating a first surface voltage and a second surface voltage of a first insulating layer that includes silicon oxide.

Exemplary embodiments of the invention are described below with reference to the accompanying drawings. The invention may, however, be embodied in many different forms and should not be construed as limited to the embodiments set forth herein. Rather, the embodiments are provided so that disclosure of the invention is thorough and complete, and fully conveys the scope of the invention to those skilled in the art. The principles and features of this invention may be employed in varied and numerous additional embodiments without departing from inventive principles described in the exemplary embodiments. In the drawings, the size and relative sizes of layers and regions may be exaggerated for clarity. The drawings are not to scale. Like reference numerals refer to like elements throughout.

For purposes of this disclosure, when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

According to some embodiments of the invention, a first insulating layer is prepared. The first insulating layer may include silicon oxide. Alternatively, the first insulating layer may include a material having a relatively high dielectric constant. Examples of a material having a relatively high dielectric constant are aluminum oxide, hafnium oxide, and lanthanum oxide.

A first initial surface charge amount of the first insulating layer is measured. When the first initial surface charge amount is below a standard surface charge amount, the first insulating layer is provided with a positive charge such as a hydronium ion ($H_3O^+$). Thus, the first initial surface charge amount of the first insulating layer may be set at the standard surface charge amount. On the other hand, when the first initial surface charge amount of the first insulating layer is above the standard surface charge amount, the first insulating layer is provided with a negative charge such as a carbonate ion ($CO_3^-$). Thus, the first initial surface charge amount of the first insulating layer may be set at the standard surface charge amount. For example, the standard surface charge amount may be about 0 q/cm$^2$.

The first insulating layer having the standard surface charge amount is then provided with light. In addition, the positive charge such as the hydronium ion ($H_3O^+$) is repeatedly supplied onto the first insulating layer by a predetermined amount so that a surface charge amount of the first insulating layer may discontinuously increase. Each time that the predetermined amount of the positive charge is supplied to the first insulating layer, a first surface voltage of the first insulating layer is measured.

Thereafter, the negative charge such as the carbonate ion is supplied to the first insulating layer so that the surface charge amount of the first insulating layer may be reset to the standard surface charge amount.

The light supplied to the first insulating layer having the standard surface charge amount is then removed. In addition, the positive charge such as the hydronium ion is repeatedly supplied onto the first insulating layer by the predetermined amount so that the surface charge amount of the first insulating layer may discontinuously increase. Each time that the predetermined amount of the positive charge is supplied to the first insulating layer, a second surface voltage of the first insulating layer is measured.

As described above, the second surface voltage is measured after the first surface voltage is measured. Alternatively, the second surface voltage may be measured before the first surface voltage is measured.

FIG. 1 is a graph showing the first surface voltage and the second surface voltage of a first insulating layer that includes silicon oxide.

Referring to FIG. 1, a first curve and a second curve indicate the first surface voltage and the second surface voltage, respectively. The first surface voltage is substantially the same as the second surface voltage in an accumulation region where the surface charge amount is below about $4\times10^{11}$ q/cm$^2$. Thus, a difference between the first surface voltage and the second surface voltage in the accumulation region is about zero. The difference between the first surface voltage and the second surface voltage increases in a depletion region where the surface charge amount is about $4\times10^{11}$ q/cm$^2$ to about $8\times10^{11}$ q/cm$^2$. The difference between the first surface voltage and the second surface voltage is constantly maintained at about 0.36 V in an inversion region where the surface charge amount is above about $8\times10^{11}$ q/cm$^2$.

Figure 2:
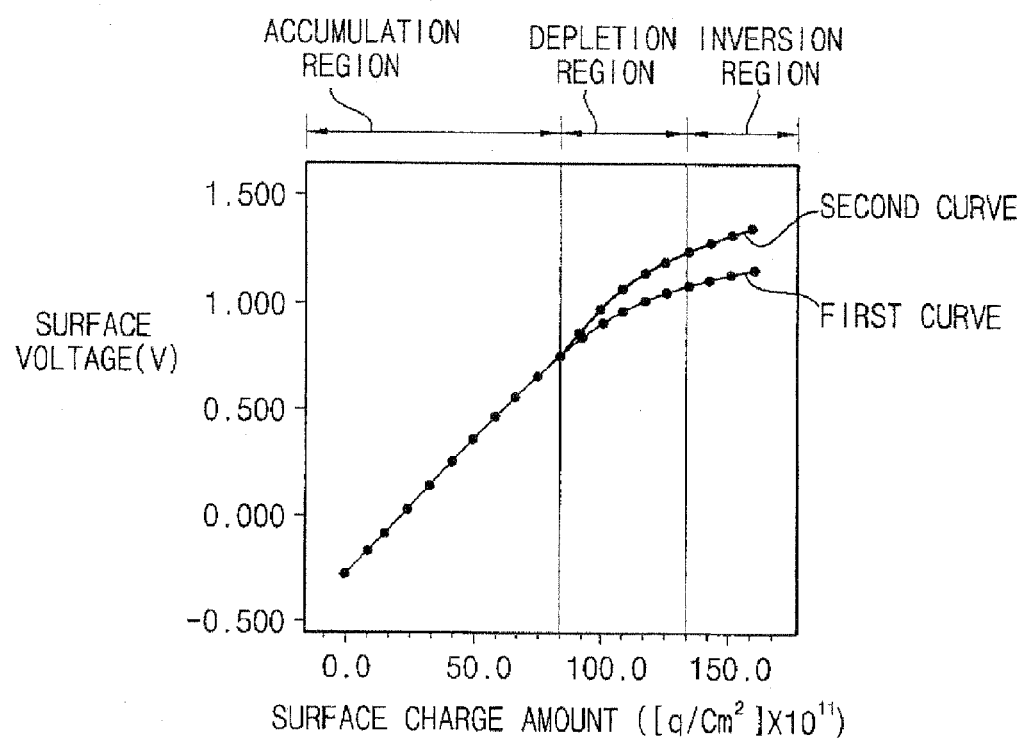
FIG. 2 is a graph illustrating a first surface voltage and a second surface voltage of a first insulating layer that includes a material having a relatively high dielectric constant.

FIG. 2 is a graph showing the first surface voltage and the second surface voltage of a first insulating layer including a material having a relatively high dielectric constant.

Referring to FIG. 2, a first curve and a second curve indicate the first surface voltage and the second surface voltage, respectively. The first surface voltage is substantially the same as the second surface voltage in an accumulation region where the surface charge amount is below about $80\times10^{11}$ q/cm$^2$. Thus, a difference between the first surface voltage and the second surface voltage is about zero in the accumulation region. The difference between the first surface voltage and the second surface voltage increases in a depletion region where the surface charge amount is about $80\times10^{11}$ q/cm$^2$ to about $130\times10^{11}$ q/cm$^2$. The difference between the first surface voltage and the second surface voltage is constantly maintained at about 0.25 V in an inversion region where the surface charge amount is above about $130\times10^{11}$ q/cm$^2$.

As described above, a region where the first surface voltage is substantially the same as the second surface voltage is defined as the accumulation region. That is, a difference between the first surface voltage and the second surface voltage is about zero in the accumulation region. A region where the difference between the first surface voltage and the second surface voltage increases is defined as the depletion region. A region where the difference between the first surface voltage and the second voltage is constantly maintained at a predetermined positive value is defined as the inversion region.

The depletion region includes information of an interface trap density, a flat band voltage, and a total charge amount. Thus, it is desirable to quickly obtain precise data regarding the depletion region.

Thus, libraries of a first surface charge amount are obtained by comparing the first curve with the second curve. Particularly, the libraries include information concerning a first surface charge amount where the depletion region begins and a second surface charge amount where the depletion region ends.

In particular, referring again to FIG. 1, the first surface charge amount and the second surface charge amount are about $4 \times 10^{11}$ q/cm$^2$ and about $8 \times 10^{11}$ q/cm$^2$, respectively. In addition, referring again to FIG. 2, the first surface charge amount and the second surface charge amount are about $80 \times 10^{11}$ q/cm$^2$ and about $130 \times 10^{11}$ q/cm$^2$, respectively.

Thereafter, a second insulating layer that is substantially the same as the first insulating layer is prepared. A second initial surface voltage of the second insulating layer is then measured. When the second initial surface charge amount is below the standard surface charge amount, the second insulating layer is provided with the positive charge such as the hydronium ion. Thus, the second initial surface charge amount of the second insulating layer may be set at the standard surface charge amount. On the other hand, when the second initial surface charge amount of the second insulating layer is above the standard surface charge amount, the second insulation is provided with the negative charge such as the carbonate ion. Thus, the second initial surface charge amount of the second insulating layer may be set at the standard surface charge amount. For example, the standard surface charge amount may be about 0 q/cm$^2$.

The second insulating layer having the standard surface charge amount is then provided with light. Before the surface charge amount of the second insulating layer becomes the same as the first surface charge amount, the positive charge such as the hydronium ion is repeatedly supplied onto the second insulating layer by a first amount so that the surface charge amount of the second insulating layer may discontinuously increase.

In addition, each time that the first amount of the positive charge is supplied onto the second insulating layer, a third surface voltage of the second insulating layer is measured.

Before the surface charge amount of the second insulating layer becomes the second surface charge amount from the first surface charge amount, the positive charge is repeatedly supplied onto the second insulating layer by a second amount that is substantially smaller than the first amount so that the surface charge amount of the second insulating layer may discontinuously increase. In addition, each time that the second amount of the positive charge is supplied onto the second insulating layer, the third surface voltage of the second insulating layer is measured.

After the surface charge amount of the second insulating layer becomes the second surface charge amount, the positive charge is repeatedly supplied onto the second insulating layer by a third amount that is substantially larger than the second amount so that the surface charge amount of the second insulating layer may discontinuously increase. In addition, each time that the third amount of the positive charge is supplied onto the second insulating layer, the third surface voltage of the second insulating layer is measured.

Thereafter, the negative charge such as the carbonate ion is supplied onto the second insulating layer so that the surface charge amount of the second insulating layer may be reset to the standard surface charge amount.

The light supplied to the second insulating layer having the standard surface charge amount is then removed. Before the surface charge amount of the second insulating layer becomes the first surface charge amount, the positive charge such as the hydronium ion ($H_3O^+$) is repeatedly supplied onto the second insulating layer by the first amount so that the surface charge amount of the second insulating layer may discontinuously increase. In addition, each time that the first amount of the positive charge is supplied onto the second insulating layer, a fourth surface voltage of the second insulating layer is measured.

Before the surface charge amount of the second insulating layer becomes the second surface charge amount from the first surface charge amount, the positive charge is repeatedly supplied onto the second insulating layer by the second amount that is substantially smaller than the first amount so that the surface charge amount of the second insulating layer may discontinuously increase. In addition, each time that the second amount of the positive charge is supplied onto the second insulating layer, the fourth surface voltage of the second insulating layer is measured.

After the surface charge amount of the second insulating layer becomes the second surface charge amount, the positive charge is repeatedly applied to the second insulating layer by the third amount substantially larger than the second amount so that the surface charge amount of the second insulating layer may discontinuously increase. In addition, each time that the third amount of the positive charge is supplied onto the second insulating layer, the third surface voltage of the second insulating layer is measured.

As described above, the fourth surface voltage is measured after the third surface voltage is measured. Alternatively, the fourth surface voltage may be measured before the third surface voltage is measured.

In some embodiments, the first amount is substantially the same as the third amount. In this case, the first amount and the third amount may be greater than the second amount by a factor of about 2.5.

Thereafter, data regarding the depletion region where a difference between the third surface voltage and the fourth surface voltage increases is obtained.

Figure 3:
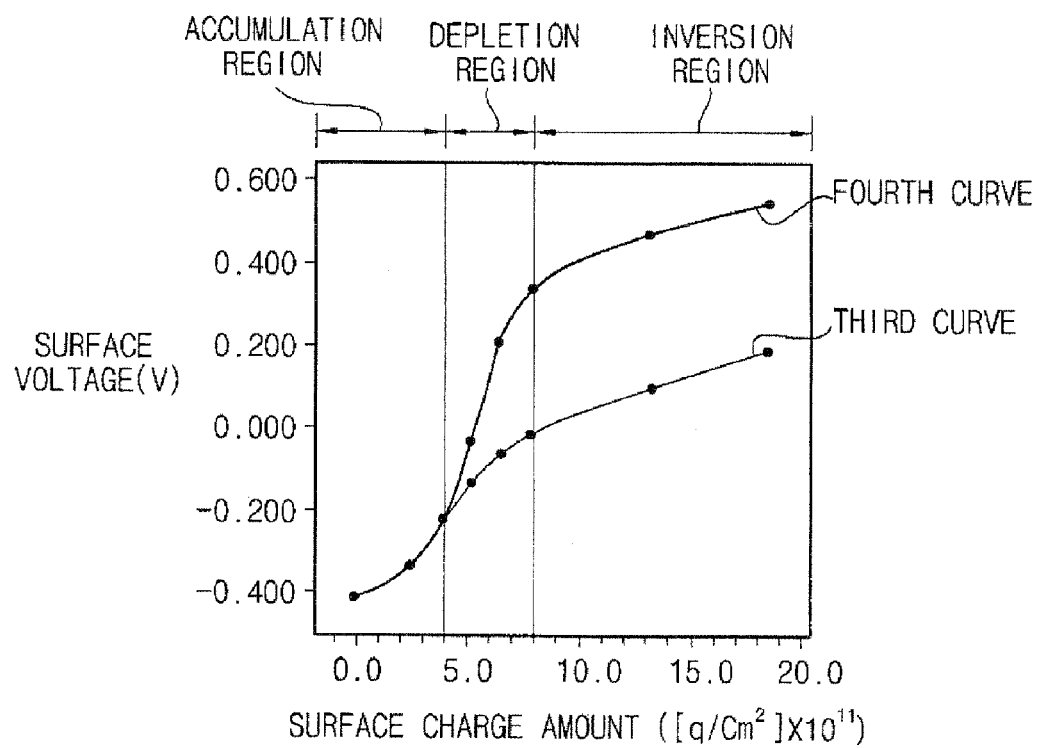
FIG. 3 is a graph illustrating a third surface voltage and a fourth surface voltage of a second insulating layer that includes silicon oxide.

FIG. 3 is a graph showing a third surface voltage and a fourth surface voltage of a second insulating layer that includes silicon oxide.

Referring to FIG. 3, a third curve and a fourth curve indicate a third surface voltage and a fourth surface voltage, respectively. The number of measurement points of the third curve and the fourth curve is relatively small in the accumulation region and the inversion region. Thus, data from the depletion region may be quickly obtained. In addition, the number of the measurement points of the third curve and the fourth curve in the depletion region is relatively large. Thus, precise data of the depletion region having information concerning the interface trap density, the flat band voltage and the total charge amount may be quickly obtained.

Figure 4:
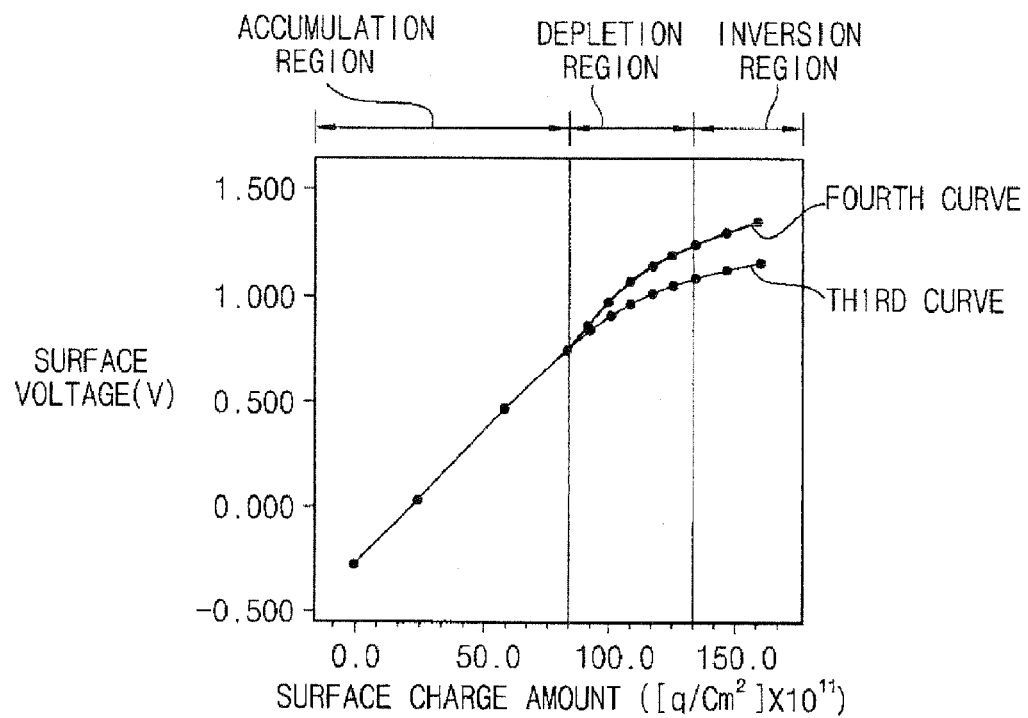
FIG. 4 is a graph illustrating a third surface voltage and a fourth surface voltage of a second insulating layer that includes a material having a relatively high dielectric constant.

FIG. 4 is a graph showing a third surface voltage and a fourth surface voltage of a second insulating layer including a material having a relatively high dielectric constant.

Referring to FIG. 4, a third curve and a fourth curve indicate the third surface voltage and the fourth surface voltage, respectively. The number of measurement points in the third curve and the fourth curve is relatively small in an accumulation region and an inversion region. Thus, data of the depletion region may be quickly obtained. In addition, the number of the measurement points in the third curve and the fourth curve is relatively large in the depletion region. Thus, a precise data of the depletion region having information concerning the interface trap density, the flat band voltage and the total charge amount may be quickly obtained.

Thereafter, a surface voltage measurement may be further performed on the n-th ("n" is a natural number above 3) insulating layer, where the n-th insulating layer is substantially the same as the first insulating layer.

In particular, the n-th insulating layer is prepared. An n-th initial surface charge amount of the n-th insulating layer is then measured. When the n-th initial surface charge amount is below a standard surface charge amount, the n-th insulating layer is provided with a positive charge such as a hydronium ion. Thus, the n-th initial surface charge amount may be set at the standard surface charge amount. On the other hand, when the n-th initial surface charge amount is above the standard surface charge amount, the n-th insulating layer is provided with a negative charge such as a carbonate ion. Thus, the n-th initial surface charge amount may be set at the standard surface charge amount. For example, the standard surface charge amount may be about 0 q/cm$^2$.

The n-th insulating layer having the standard surface charge amount is then provided with light. Before the surface charge amount of the n-th insulating layer becomes the first surface charge amount, the positive charge such as the hydronium ion ($H_3O^+$) is repeatedly supplied onto the n-th insulating layer by the first amount so that the surface charge amount of the n-th insulating layer may discontinuously increase. In addition, each time that the first amount of the positive charge is supplied onto the n-th insulating layer, a (2n−1)-th surface voltage of the n-th insulating layer is measured.

Before the surface charge amount of the n-th insulating layer becomes the second surface charge amount from the first surface charge amount, the positive charge is repeatedly supplied onto the n-th insulating layer by the second amount that is substantially smaller than the first amount so that the surface charge amount of the n-th insulating layer may discontinuously increase. In addition, each time that the second amount of the positive charge is supplied onto the n-th insulating layer, the (2n−1)-th surface voltage of the n-th insulating layer is measured.

After the surface charge amount of the n-th insulating layer becomes the second surface charge amount, the positive charge is repeatedly supplied onto the n-th insulating layer by the third amount that is substantially larger than the second amount so that the surface charge amount of the n-th insulating layer may discontinuously increase. In addition, each time that the third amount of the positive charge is supplied onto the n-th insulating layer, the (2n−1)-th surface voltage of the n-th insulating layer is measured.

Thereafter, the negative charge such as the carbonate ion ($CO_3^-$) is supplied onto the n-th insulating layer so that the surface charge amount of the n-th insulating layer may be reset into the standard surface charge amount.

The light supplied onto the n-th insulating layer having the standard surface charge amount is then removed. Before the surface charge amount of the n-th insulating layer becomes the first surface charge amount, the positive charge such as the hydronium ion is repeatedly supplied onto the n-th insulating layer by the first amount so that the surface charge amount of the second insulating layer may discontinuously increase. In addition, each time that the first amount of the positive charge is supplied onto the n-th insulating layer, a 2n-th surface voltage of the second insulating layer is measured. Before the surface charge amount of the n-th insulating layer becomes the second surface charge amount from the first surface charge amount, the positive charge is repeatedly supplied onto the n-th insulating layer by the second amount substantially smaller than the first amount so that the surface charge amount of the n-th insulating layer may discontinuously increase. In addition, each time that the second amount of the positive charge is supplied onto the n-th insulating layer, the 2n-th surface voltage of the n-th insulating layer is measured. After the surface charge amount of the n-th insulating layer becomes the second surface charge amount, the positive charge is repeatedly supplied onto the n-th insulating layer by the third amount substantially larger than the second amount so that the surface charge amount of the n-th insulating layer may discontinuously increase. In addition, each time that the third amount of the positive charge is supplied onto the n-th insulating layer, the 2n-th surface voltage of the n-th insulating layer is measured.

As described above, the 2n-th surface voltage is measured after the (2n−1)-th surface voltage is measured. Alternatively, the 2n-th surface voltage may be measured before the (2n−1)-th surface voltage is measured.

Thereafter, data of the depletion region within which a difference between the (2n−1)-th surface voltage and the 2n-th surface voltage increases is obtained by comparing the (2n−1)-th surface voltage with the 2n-th surface voltage.

According to embodiments of the invention, a relatively precise data of a depletion region having information concerning an interface trap density, a flat band voltage and a total charge amount may be quickly obtained.

The invention may be practiced in many ways. What follows are exemplary, non-limiting descriptions of some embodiments of the invention.

In accordance with some embodiments, a method of measuring a surface voltage of an insulating layer includes measuring first surface voltage values of a first insulating layer each time that a surface charge amount of the first insulating layer increases by a first amount in a light state where the first insulating layer is provided with light.

Second surface voltage values of the first insulating layer are measured each time that the surface charge amount of the first insulating layer increases by the first amount in a dark state where the first insulating layer is not provided with the light.

The first surface voltage values are compared to the second surface voltage values to obtain libraries concerning an accumulation region, a depletion region and an inversion region. The first surface voltage value is substantially the same as the second surface voltage value in the accumulation region. A difference between the first surface voltage and the second surface voltage increases in the depletion region. The difference between the first surface voltage and the second surface voltage is constantly maintained at a predetermined positive value in the inversion region.

Third surface voltage values of a second insulating layer that is substantially the same as the first insulating layer are measured each time that a surface charge amount of the second insulating layer increases in the light state where the second insulating layer is provided with the light. The surface charge amount of the second insulating layer is repeatedly increased by a second amount in the depletion region. The surface charge amount of the second insulating layer is repeatedly increased in the accumulation region and the inversion region by a third amount that is substantially larger than the second amount.

Fourth surface voltage values of the second insulating layer that is substantially the same as the first insulating layer are measured each time that a surface charge amount of the fourth insulating layer increases in the dark state where the fourth insulating layer is not provided with the light. The surface charge amount of the fourth insulating layer is repeatedly increased by the second amount in the depletion region. The surface charge amount of the fourth insulating layer is repeatedly increased in the accumulation region and the inversion region by the third amount.

Data concerning a region within which a difference between the fourth surface voltage and the third surface voltage increases is obtained by comparing the third surface voltage values with the Fourth surface voltages.

According to embodiments of the invention, relatively precise data concerning a depletion region may quickly be obtained.

The foregoing is illustrative of the invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

The invention claimed is:

1. A method of measuring a surface voltage of an insulating layer, the method comprising:
    measuring first surface voltage values of a first insulating layer each time that a surface charge amount of the first insulating layer increases by a first amount in a light state where the first insulating layer is provided with light;
    measuring second surface voltage values of the first insulating layer each time that the surface charge amount of the first insulating layer increases by the first amount in a dark state where the first insulating layer is not provided with the light;
    comparing the first surface voltage values with the second surface voltage values to obtain libraries concerning an accumulation region, a depletion region and an inversion region, the first surface voltage value being substantially the same as the second surface voltage value in the accumulation region, a difference between the first surface voltage and the second surface voltage increasing in the depletion region, the difference between the first surface voltage and the second surface voltage being constantly maintained at a predetermined positive value in the inversion region;
    measuring third surface voltage values of a second insulating layer substantially the same as the first insulating layer each time that a surface charge amount of the second insulating layer increases in the light state where the second insulating layer is provided with the light, the surface charge amount of the second insulating layer being repeatedly increased by a second amount in the depletion region, the surface charge amount of the second insulating layer being repeatedly increased in the accumulation region and the inversion region by a third amount substantially larger than the second amount;
    measuring fourth surface voltage values of the second insulating layer substantially the same as the first insulating layer each time that a surface charge amount of the fourth insulating layer increases in the dark state where the fourth insulating layer is not provided with the light, the surface charge amount of the fourth insulating layer being repeatedly increased by the second amount in the depletion region, the surface charge amount of the fourth insulating layer being repeatedly increased in the accumulation region and the inversion region by the third amount; and
    obtaining data concerning a region within which a difference between the fourth surface voltage and the third surface voltage increases by comparing the third surface voltage values with the fourth surface voltages.

2. The method of claim 1, further comprising:
    measuring $(2n-1)$-th surface voltage values of a n-th insulating layer substantially the same as the first insulating layer each time that a surface charge amount of the n-th insulating layer increases in the light state where the n-th insulating layer is provided with light, the surface charge amount of the n-th insulating layer being repeatedly increased by the second amount in the depletion region, the surface charge amount of the n-th insulating layer being repeatedly increased in the accumulation region and the inversion region by the third amount;
    measuring 2n-th surface voltage values of the n-th insulating layer each time that a surface charge amount of the n-th insulating layer increases in the dark state where the n-th insulating layer is not provided with light, the surface charge amount of the n-th insulating layer being repeatedly increased by the first amount in the depletion region, the surface charge amount of the fourth insulating layer being repeatedly increased by the third amount in the accumulation region and the inversion region; and
    obtaining data concerning a region within which a difference between the 2n-th surface voltage and the $(2n-1)$-th surface voltage increases by comparing the 2n-th surface voltage with the $(2n-1)$-th surface voltage.

3. The method of claim 1, wherein an initial surface charge amount of the first insulating layer is about 0 q/cm$^2$.

4. The method of claim 1, wherein the first insulating layer includes silicon oxide.

5. The method of claim 1, wherein the first insulating layer includes a material having a relatively high dielectric constant.

6. The method of claim 5, the material having the relative high dielectric constant is at least one selected from the group consisting of aluminum oxide, hafnium oxide and lanthanum oxide.

7. The method of claim 1, wherein the second amount is no more than the first amount.

8. The method of claim 1, wherein the third amount is about 2.5 times the second amount.

9. The method of claim 1, wherein the surface charge amounts of the first and second insulating layers are increased by supplying positive charges to the first and second insulating layers.

10. The method of claim 9, wherein the positive charge is hydronium ions.

11. A method comprising:
    during a first light state when a first insulating layer is provided with a light, measuring a first surface voltage of the first insulating layer each time that a surface charge amount of the first insulating layer increases by a first amount to obtain first surface voltage values;

during a first dark state when the first insulating layer is not provided with the light, measuring a second surface voltage of the first insulating layer each time that the surface charge amount of the first insulating layer increases by the first amount to obtain second surface voltage values; and comparing the first surface voltage values to the second surface voltage values to identify an accumulation region where the first surface voltage values are substantially the same as the second surface voltage values, to identify a depletion region where a difference between the first surface voltage values and the second surface voltage values increase, and to identify an inversion region where the difference between the first surface voltage values and the second surface voltage values remains substantially constant.

12. The method of claim 11, further comprising:

during a second light state when a second insulating layer is provided with the light, repeatedly measuring a third surface voltage of the second insulating layer to obtain third surface voltage values, the third surface voltage measured each time that a surface charge amount of the second insulating layer increases by a second amount in the accumulation region, each time that the surface charge amount of the second insulating layer increases by a third amount in the depletion region, and each time that the surface charge amount of the second insulating layer increases by the second amount in the inversion region, the second amount substantially larger than the third amount, the second insulating layer composed of substantially the same material as the first insulating layer;

during a second dark state when the second insulating layer is not provided with the light, repeatedly measuring a fourth surface voltage of the second insulating layer to obtain fourth surface voltage values, the fourth surface voltage measured each time that the surface charge amount of the second insulating layer increases by the third amount in the accumulation region, each time that the surface charge amount of the second insulating layer increases by the second amount in the depletion region, and each time that the surface charge amount of the second insulating layer increases by the third amount in the inversion region; and comparing the third surface voltage values with the fourth surface voltages to obtain data concerning a region where a difference between the fourth surface voltage and the third surface voltage increases.

13. The method of claim 12, wherein the first light state occurs before the first dark state, and the second light state occurs before the second dark state.

14. The method of claim 12, wherein the first dark state occurs before the first light state, and the second dark state occurs before the second light state.

15. A method comprising:

while illuminating a first insulating layer with a light source, repeatedly increasing a surface charge of the first insulating layer by a first amount and measuring a surface voltage of the first insulating layer each time that the surface charge is increased by the first amount to obtain first surface voltage values;

while the first insulating layer is not illuminated by the light source, repeatedly increasing the surface charge of the first insulating layer by the first amount and measuring the surface voltage of the first insulating layer each time that the surface charge is increased by the first amount to obtain second surface voltage values;

comparing the first surface voltage values to the second surface voltage values to identify an accumulation region where the first surface voltage values are substantially the same as the second surface voltage values, to identify a depletion region where a difference between the first surface voltage values and the second surface voltage values increase, and to identify an inversion region where the difference between the first surface voltage values and the second surface voltage values remains substantially constant;

while illuminating a second insulating layer that is substantially the same as the first insulating layer with the light source, repeatedly increasing a surface charge of the second insulating layer through the accumulation region, the depletion region, and the inversion region and measuring a surface voltage of the second insulating layer each time the surface charge is increased to obtain third surface voltage values, the surface charge of the second insulating layer increased by a second amount in the depletion region and by a third amount in the accumulation region and the inversion region, the third amount larger than the second amount;

while the second insulating layer is not illuminated by the light source, repeatedly increasing the surface charge of the second insulating layer through the accumulation region, the depletion region, and the inversion region and measuring the surface voltage of the second insulating layer each time the surface charge is increased to obtain fourth surface voltage values, the surface charge of the second insulating layer increased by the second amount in the depletion region and by the third amount in the accumulation region and the inversion region; and comparing a set of third surface voltage values with a set of fourth surface voltage values to obtain information concerning a trap density, a flat band voltage, and a total charge amount, the set of third surface voltage values and the set of fourth surface voltage values corresponding to the depletion region.

* * * * *

UNITED STATES PATENT AND TRADEMARK OFFICE
CERTIFICATE OF CORRECTION

PATENT NO.        : 7,394,279 B2  
APPLICATION NO.   : 11/461312  
DATED             : July 1, 2008  
INVENTOR(S)       : Mi-Sung Lee et al.

Page 1 of 1

It is certified that error appears in the above-identified patent and that said Letters Patent is hereby corrected as shown below:

Column 9, line 14, the word "Fourth" should read -- fourth --;  
Column 12, line 49, the word "fiat" should read -- flat --.

Signed and Sealed this

Thirtieth Day of December, 2008

JON W. DUDAS  
*Director of the United States Patent and Trademark Office*